(12) United States Patent
Furubayashi et al.

(10) Patent No.: US 6,284,432 B1
(45) Date of Patent: *Sep. 4, 2001

US006284432B1

(54) COLORING COMPOSITION

(75) Inventors: Toshiki Furubayashi, Hyogo; Keisuke Ito, Toyonaka; Kaori Yamamoto, Tottori, all of (JP)

(73) Assignee: Sumitomo Chemical Company, Limited, Osaka (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 65 days.

(21) Appl. No.: 09/286,432

(22) Filed: Apr. 6, 1999

(30) Foreign Application Priority Data

Apr. 6, 1998 (JP) .................................................. 10-093618

(51) Int. Cl.$^7$ .............................. G03F 7/027; G03C 1/73
(52) U.S. Cl. .................................. 430/281.1; 430/286.1; 430/905; 524/92; 524/597; 524/720
(58) Field of Search .............................. 430/270.1, 286.1, 430/281.1, 905, 913; 524/92, 597, 720

(56) References Cited

U.S. PATENT DOCUMENTS

| | | | | |
|---|---|---|---|---|
| 5,368,976 | * | 11/1994 | Tajima et al. ........................ | 430/176 |
| 5,489,621 | * | 2/1996 | Sato et al. ........................ | 430/281.1 |

FOREIGN PATENT DOCUMENTS

| | | | |
|---|---|---|---|
| 604895A1 | * | 12/1993 | (EP) . |
| 0606632 A | | 7/1994 | (EP) . |
| 659842A2 | * | 12/1994 | (EP) . |
| 08-171014 A | | 7/1996 | (JP) . |
| 08-295808 A | | 11/1996 | (JP) . |
| 10300920A | * | 11/1998 | (JP) . |
| 11014824A | * | 1/1999 | (JP) . |

\* cited by examiner

*Primary Examiner*—Janet Baxter
*Assistant Examiner*—Yvette M. Clarke
(74) *Attorney, Agent, or Firm*—Birch, Stewart, Kolasch & Birch, LLP

(57) ABSTRACT

A coloring composition for a color filter, which comprises (i) an organic pigment, (ii) a binder, and (iii) a pigment derivative which is an organic pigment to which a sulfonate group and a sulfonamide group are bonded or a salt thereof, is provided, and using the coloring composition, a color filter which manifests excellent coat property, has not special color unevenness and has excellent contrast can be produced.

8 Claims, No Drawings

COLORING COMPOSITION

FIELD OF THE INVENTION

The present invention relates to a coloring composition useful for producing a color filter used in a color liquid crystal display, color video camera and the like.

DESCRIPTION OF THE RELATED ART

A color filter used in a color liquid crystal display, color video camera and the like is usually produced by forming three transparent colored fine patterns of red (R), green (G) and blue (B) on a transparent substrate such as glass or an opaque substrate such as silicon. For forming three transparent colored fine patterns, a so-called dyeing method has been often adopted in which a photosensitive layer such as a layer made of gelatin is patterned by photolithography and dyeing, and this procedure is repeated three-times. Since conventional dyes usable in such a dyeing method have limited light-resistance and heat-resistance, although excellent in color property, organic pigments excellent in light-resistance and heat-resistance have been increasingly used as coloring materials for producing color filters instead of dyes.

When a color filter is produced using an organic pigment, a pigment is generally dispersed in a dispersing medium composed of a resin and a solvent to prepare a coloring composition for a color filter, then, the resulting coloring composition is applied on a substrate to form a coated film. Fine color elements are formed on the coated film by a photolithography method, printing method, electrodeposition method and the like.

However, when a conventional coloring composition for a color filter is used, dispersion of the pigment is unstable and coagulation tends to occur. Therefore, it has been difficult to produce a color filter excellent in contrast (maintenance of polarization). For applying such a coloring composition onto a substrate, a spin coat method is usually adopted in which the coloring composition is dropped on the substrate and the substrate was rotated at high speed to spread the composition. However, when a conventional coloring composition for a color filter is spin-coated, film thickness of center part remarkably increases and a uniform coat can not be obtained easily.

SUMMARY OF THE INVENTION

An object of the present invention is to provide a coloring composition in which the pigment dispersion is stable and hardly causes coagulation, and which can produce a color filter excellent in contrast. Another object of the present invention is to provide a coloring composition for a color filter which does not cause increase in thickness of the central part when spin-coated and provides a uniform coat.

The present inventors have intensively investigated using commercially available organic pigments for solving the above-described problems. As a result, they have found that the above objects can be attained by using a specific pigment derivative as an additive. The present invention was thus completed.

Namely, the present invention provides a coloring composition for a color filter, which comprises (i) an organic pigment, (ii) a binder, and (iii) a pigment derivative which is an organic pigment to which a sulfonate group and a sulfonamide group are bonded or a salt thereof.

As the organic pigment to which a sulfonate group and a sulfonamide group are bonded, compounds represented by the following formula (I) can be specifically listed.

wherein, D represents an organic pigment residue;

$R^1$ represents a hydrogen atom or a hydrocarbon residue which may be substituted;

X represents a group $—C_kH_{2k}NR^2R^3$, wherein k represents a number from 1 to 10, and $R^2$ and $R^3$ each independently represents a hydrocarbon residue which may be substituted, or $R^2$, $R^3$ and the nitrogen atom to which $R^2$ and $R^3$ are bonded together form a hetero ring which may optionally contain another hetero atom selected from nitrogen, oxygen and sulfur as a ring atom, or X represents an alkyl group which is substituted with a hetero ring containing at least one hetero atom selected from nitrogen, oxygen and sulfur as a ring atom, the alkyl group bonding to a carbon atom in the hetero ring; or $R^1$, X and the nitrogen atom to which $R^1$ and X are bonded together form a hetero ring containing at least one other nitrogen atom as a ring atom;

m represents a number from 0.5 to 3; and n represents a number from 0.5 to 3.5.

The total of m and n is preferably in the range from 1 to 5.

The organic pigment which residue is to be bonded to a sulfonate group and a sulfonamide group to form the pigment derivative (iii) is optionally the same as organic pigment (i), although, in general, it is advantageous that they are identical.

DETAILED DESCRIPTION OF THE PREFERRED EMBODIMENTS

Examples of the organic pigment which residue is to be bonded to a sulfonate group and a sulfonamide group to form the pigment derivative (iii) include condensed azo, triphenodioxadine, dianthraquinonyl, benzimidazolone, anthrapyrimidine, flavanthorone, antanethorone, indanethorone, pyranthorone, violanthorone, isoviolanthorone, quinacridone, quinophtharone, phthalocyanine, diletopyrrolopyrrole, isoindolinone, perynone, perylene, thioindigo pigments and the like. Residues of these pigments, namely, groups obtained by removing suitable number of hydrogen atoms from these pigment skeletons can be D in the formula (I).

Specific examples of the organic pigment which residue is to be bonded to a sulfonate group and a sulfonamide group to form the pigment derivative (iii) include condensed azo pigments represented by the following formula (II):

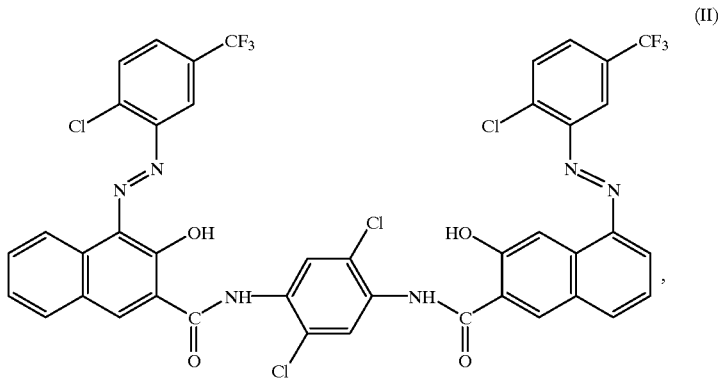

such as compounds known as C. I. Pigment Red 242, triphenodioxadine pigments represented by the following formula (III):

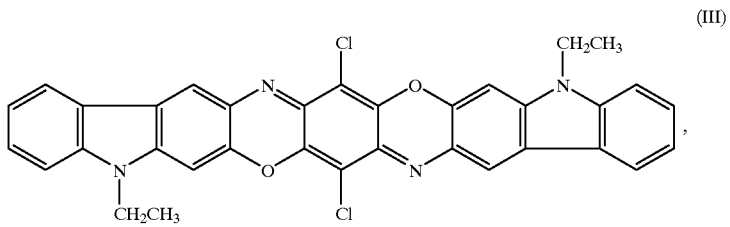

such as compounds known as C. I. Pigment Violet 23, dianthraquinonyl pigments represented by the following formula (IV):

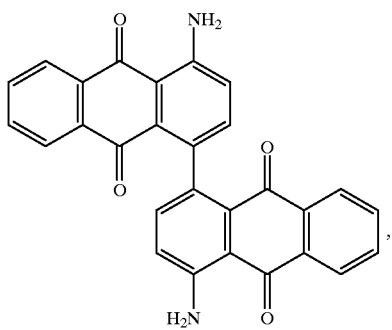

such as compounds known as C. I. Pigment Red 177 and the like.

In the formula, $R^1$ may be a hydrogen atom or a hydrocarbon residue, and the hydrocarbon residue may have a substituent. The hydrocarbon residue represented by $R^1$ may be any of aliphatic, aromatic and aromatic aliphatic compounds. The aliphatic hydrocarbon residue represented by $R^1$ preferably has about 1 to 10 carbon atoms. The aromatic hydrocarbon residue represented by $R^1$ preferably has about 6 to 10 carbon atoms. The aromatic aliphatic hydrocarbon residue represented by $R^1$ preferably has about 7 to 10 carbon atoms. The aliphatic hydrocarbon residues represented by $R^1$ includes alkyl, alkenyl and alkynyl groups and the like, and more preferably is an alkyl group having 1 to 6 carbon atoms. The aromatic hydrocarbon residues include phenyl, alkyl-substituted phenyl and naphthyl groups and the like. The aromatic aliphatic hydrocarbon residues include benzyl, phenethyl, nuclear alkyl-substituted benzyl groups and the like. Examples of the group which can be substituted on these hydrocarbon residues include amino groups which are unsubstituted or mono- or di-substituted with an alkyl group having 1 to 6 carbon atoms or a hydroxyalkyl group having 1 to 6 carbon atoms, and alkoxy groups having 1 to 6 carbon atoms which are unsubstituted or substituted with a hydroxy group or an alkoxy group having 1 to 6 carbon atoms.

In the formula (I), X may represent a group $-C_kH_{2k}NR^2R^3$, wherein k represents a number from 1 to 10, and $R^2$ and $R^3$ each independently represents a hydrocarbon residue which may be substituted or $R^2$, $R^3$ and the nitrogen atom to which $R^2$ and $R^3$ are bonded together form a hetero ring which may optionally contain another hetero atom selected from nitrogen, oxygen and sulfur as a ring atom. The alkylene group represented by $-C_kH_{2k}$ may be straight, or branched when k is 2 or more, although, usually, straight is advantageous. The alkylene group represented by $-C_kH_{2k}$ preferably contains 1 to 6 carbon atoms.

The hydrocarbon residue represented by $R^2$ or $R^3$ may be any of aliphatic, aromatic and aromatic aliphatic groups. The aliphatic hydrocarbon residue represented by $R^2$ or $R^3$ preferably has about 1 to 20 carbon atoms. The aromatic hydrocarbon residue represented by $R^2$ or $R^3$ preferably has about 6 to 20 carbon atoms. The aromatic aliphatic hydrocarbon residue represented by $R^2$ or $R^3$ preferably has about 7 to 20 carbon atoms. The aliphatic hydrocarbon residues represented by $R^2$ or $R^3$ includes alkyl, alkenyl and alkynyl groups and the like, and more preferably is an alkyl group having 1 to 6 carbon atoms. The aromatic hydrocarbon residues include phenyl, alkyl-substituted phenyl and naphthyl groups and the like. The aromatic aliphatic hydrocarbon residues include benzyl, phenethyl, nuclear alkyl-substituted benzyl groups and the like. As the group which can be substituted on these hydrocarbon residues, the same groups as those exemplified for $R^1$ are also exemplified.

The hetero ring formed by $R^2$, $R^3$ and the nitrogen atom to which $R^2$ and $R^3$ are bonded preferably contains about 10 or less carbon atoms. The hetero ring may optionally contain another hetero atom selected from nitrogen, oxygen and sulfur as a ring atom in addition to the nitrogen atom to which $R^2$ and $R^3$ are bonded. Examples of the hetero ring residue include a 1-pyrrolidinyl group which is a monovalent group of pyrrolidine, a piperidino group which is a monovalent group of piperidine, a 1-piperazinyl group which is a monovalent group of piperazine, a morpholino group which is a monovalent group of morpholine, a perhydro-1,4-thiazine-4-yl group which is a monovalent group of perhydro-1,4-thiazine, a perhydroazepine-1-yl group which is a monovalent group of perhydroazepine, and the like. These hetero rings may optionally be substituted with a lower alkyl group and the like. Specific examples of such a branched hetero ring residue include 2-, 3- or 4-methylpiperidino group which is a monovalent group of pipecoline, and the like.

Alternatively, X may be an alkyl group substituted with a hetero ring which contains at least one hetero atom selected from nitrogen, oxygen and sulfur as a ring atom, the alkyl group bonding to a carbon atom in the hetero ring. That is, X is a hetero ring-substituted alkyl. In this case, number of the carbon atoms in the alkyl group is preferably about 1 to 6, and number of the carbon atoms contained in the hetero ring is preferably about 10 or less. Examples of the hetero ring residue as a substituent on the alkyl group of X include a 2- or 3-pyrrolidinyl group which is a monovalent group of pyrrolidine, a tetrahydro-2- or -3-furyl group which is a monovalent group of tetrahydrofuran, a tetrahydro-2- or -3-thienyl group which is a monovalent group of tetrahydrothiophene, a tetrahydro-2-, -3- or -4-pyranyl group which is a monovalent group of tetrahydropyran, a 2-, 3- or 4-piperidyl group which is a monovalent group of piperidine, a 2- or 3-morpholinyl group which is a monovalent group of morpholine, a perhydro-1,4-thiazine-2- or -3-yl group which is a monovalent group of perhydro-1,4-thiazine, a 2- or 3-piperazinyl group which is a monovalent group of piperazine, a perhydroazepine-2-, -3- or -4-yl group which is a monovalent group of perhydroazepine, and the like. These hetero rings may optionally be substituted with a lower alkyl group and the like, and this substituent may be bonded to any of carbon atoms or a hetero atom in the hetero ring. Specific examples of the hetero ring having a substituent include N-ethyl-2- or -3-pyrrolidinyl, N-ethyl-2-, -3- or -4-piperidyl and the like.

Further, in the formula (I), $R^1$, X and the nitrogen atom to which $R^1$ and X are bonded form a hetero ring containing at least one other nitrogen atom as a ring atom. Specifically, those containing two nitrogen atoms in total may be listed. This hetero ring can be represented by the following formula (V):

(V)

wherein, A represents a direct bond or a divalent hydrocarbon residue, such as an alkylene group, and k and $R^3$ are as defined above. Preferably, the hetero ring represented by the formula (V) is a 5- or 6-membered hetero ring. In this case, A is preferably a direct bond, methylene chain or ethylene chain. Examples of the preferable hetero ring include a 4-substituted-1-piperazinyl group which is a monovalent group of N-substituted piperazine, a 3-substituted-1-imidazolidinyl group which is a monovalent group of N-substituted imidazolidine, a 2-substituted-1-pirazolidinyl group which is a monovalent group of N-substituted pyrazolidine, and the like. Wherein, the groups to be substituted on N-position are as defined and exemplified for $R^3$ above.

In the formula (I), a part corresponding to a sulfonamide group is preferably represented by the following formula:

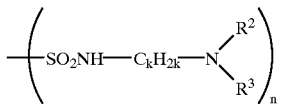

In this case, the formula (I) is represented by the following formula (Ia):

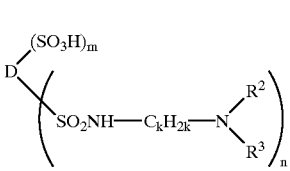

(Ia)

wherein, D, k, $R^2$, $R^3$, m and n are as define above.

Examples of the organic pigment to which a sulfonate group and a sulfonamide group are bonded and represented by the formula (I) include:

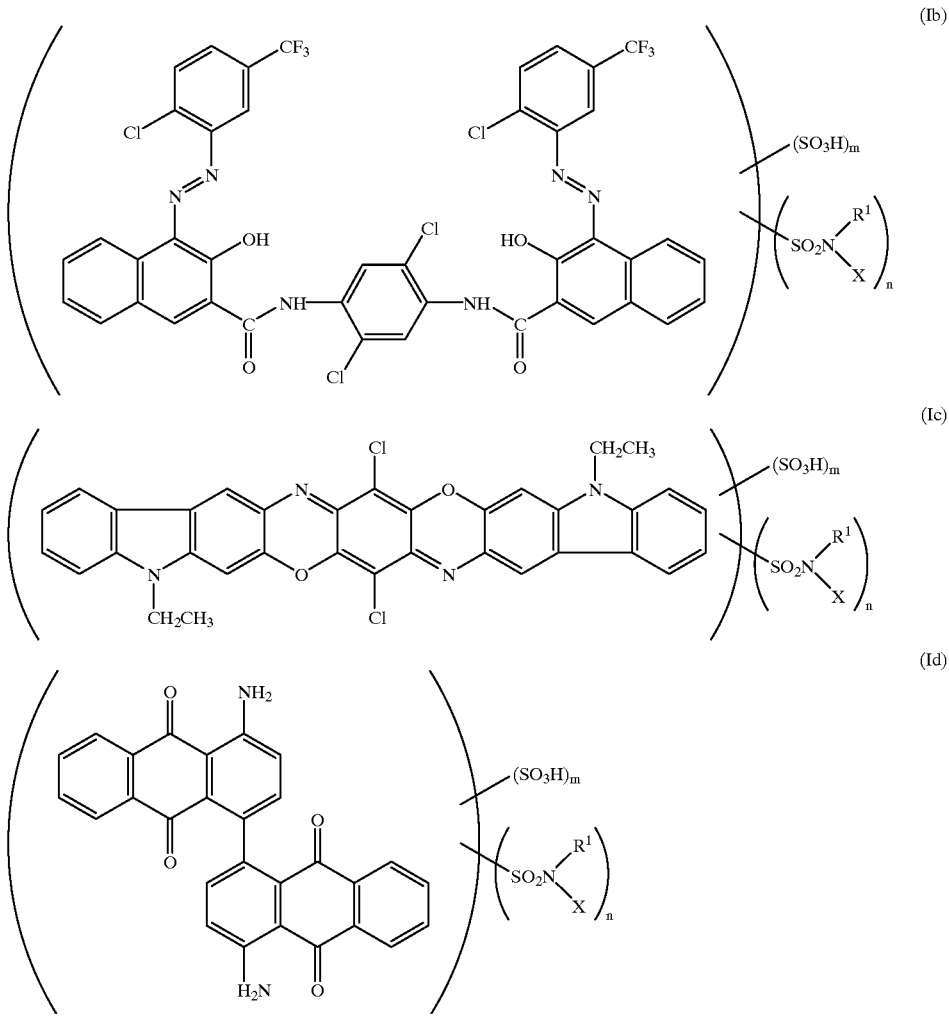

wherein, $R^1$, X, m and n are as defined above.

The pigment derivative (iii) which is an organic pigment to which a sulfonate group and a sulfonamide group are bonded or a salt thereof can be produced according to methods described in EP-A-604 895 (=JP-A No. 6-240157+ JP-A No. 6-240158+JP-A No. 6-240162), EP-A-604 632 (=JP-A No. 6-240156+JP-A No. 6-240160+JP-A No. 6-240161), EP -A-659 842 (=JP-A No. 7-188576), and the like. Specifically, it can be produced by reacting chlorosulfonic acid with any organic pigment as described above, then, allowing primary or secondary amines to react with the resulting product. More specifically, the pigment derivative represented by the formula (I) can be produced by allowing chlorosulfonic acid to react with an organic pigment which is a mother skeleton, then, allowing the resulting product to react with an amine represented by the following formula (VI)

$$X-HN-R^1 \qquad (VI)$$

wherein, $R^1$ and X are as define above.

The reaction with chlorosulfonic acid can be conducted, for example, by using an organic solvent if necessary, and contacting an organic pigment with chlorosulfonic acid in an amount of 1 to 10 moles per one mole of the organic pigment at a temperature from about $-10°$ C. to $+150°$ C. If necessary, a halogenating agent such as thionyl chloride, phosphorus oxychloride and phosphorus pentachloride may be added. The total of m and n in the formulae (I), (Ia), (Ib), (Ic) and (Id) can be appropriately varied depending on the amount and reaction temperature of chlorosulfonic acid used, and it is preferably in the range from about 1 to 5. The reaction of thus obtained reaction product with an amine can be conducted, for example, by contacting the reaction product with an amine of the formula (VI) or salt thereof in water or an organic solvent at a temperature from 0 to $150°$ C. The amount and reaction temperature in this reaction can be varied so as to appropriately control values of m and n and ratio thereof in the formula (I).

Examples of the amine of the formula (VI) in which $R^1$ is hydrogen and X is a group $—C_kH_{2k}NR^2R^3$ include N,N-dimethylethylenediamine, N,N-diethylethlenediamine, N,N-dibenzylethylenediamine, N,N-dimethyl-1,3-propanediamine, N,N-diethyl-1,3-propanediamine, N,N-diethanol-1,3-propanediamine, N,N-dibutyl-1,3-propanediamine, N,N-dimethyl-1,6-hexanediamine, N-ethyl-N-(2-aminoethyl)-m-toluidine, N-(2-aminomethyl)pyrrolidine, N-aminomethylpiperidine, N-(2-aminoethyl)piperidine, N-aminomethyl-4-pipecoline, N-(3-aminopropyl)-2-pipecoline, N-(2-aminoethyl)morpholine, N-(2-aminoethyl)piperazine, N,N-dimethylneopentanediamine, 4-N,N-diethylamino-1-methylbutylamine, 3-N,N-dibutylaminopentylamine and the like.

Examples of the amine of the formula (VI) in which $R^1$ is a hydrocarbon residue and X is a group —$C_kH_{2k}NR^2R^3$ include-N,N-dimethyl-N'-ethylethylenediamine, N,N-diethyl-N'-methylethylenediamine, N,N,N'-triethylethylenediamine, N,N'-diethyl-N-stearylethylenediamine, N'-benzyl-N,N-dimethylethylenediamine, N,N-diethyl-N'-methyl-1,3-propanediamine, N,N-diethyl-N'-2-ethoxyethyl-1,3-propanediamine, bis(2-N,N-diethylaminoetyl)amine, bis(3-N,N-dimethylaminopropyl)amine, N,N-diethyl-N'-(2-diethylaminoethyl)-1,3-propanediamine, N,N-dibutyl-N'-(2-diethylaminoethyl)-1,3-propanediamine and the like.

Examples of the amine of the formula (VI) in which X is a hetero ring-substituted alkyl include N-ethyl-2-aminomethylpyrrolidine, N-ethyl-2-(2-aminoethyl) pyrrolidine, N,N'-diethyl-2-aminomethylpyrrolidine, N,N'-diethyl-2-aminomethylpiperidine and the like.

Examples of the amine of the formula (VI) in which $R^1$, X and a nitrogen atom to which $R^1$ and X are bonded to form a hetero ring containing another nitrogen atom as a ring atom include N-methylpiperazine, N-ethylpiperazine, N-butylpiperazine, N-hydroxyethylpiperazine, N-(2-N,N-diethylaminoethyl)piperazine, N-(2-N,N-dibutylaminoethyl)piperazine, N-benzylpiperazine and the like.

Of the above-described amines, some amines are commercially available and they can be used as they are. Further, the secondary amine of the formula (VI) in which $R^1$ represents a hydrocarbon residue, or $R^1$, X and a nitrogen atom to which $R^1$ and X are bonded to form a hetero ring containing another nitrogen atom as a ring atom can be produced by a known method, for example, by allowing an alkylating agent to react with a primary amine corresponding to $H_2N-X$ or a cyclic diamine such as piperazine and the like. The alkylating agents herein used include, for example, alkyl esters of p-toluenesulfonic acid, alkylesters of benzenesulfonic acid, alkylesters of sulfuric acid, alkylesters of phosphoric acid, halogenated alkyls and the like, and the alkyl group in these compounds may be substituted. More specific alkylating agents include butyl p-toluenesulfonate, monochlorotriethylamine, benzylchloride and the like.

The sulfonate group in the pigment derivative used in the present invention, for example, the sulfonate group in the formula (I) may be a free acid, or a salt with a 1 to 3-valent metal or organic amine. Examples of the 1 to 3-valent metal constituting the salt include sodium, potassium, magnesium, calcium, strontium, barium, aluminum and the like. Examples of the organic amine constituting the salt include aliphatic amines such as ethylamine, propylamine, amylamine, hexylamine, octylamine, dodecylamine, stearylamine, diethylamine, dibutylamine and triethylamine, hetero ring amines such as pyrrolidine, pipecoline, piperidine, piperazine and morpholine, aromatic amines such as aniline and toluidine, and the like, in addition to the above-described amines used for producing the pigment derivative. The metal salt and organic amine salt of the pigment derivative can be obtained by a known method. For example, can be obtained easily by preparing an aqueous suspension of the derivative in the form of a free acid, and mixing the resulting suspension with a metal chloride, chloride of an organic amine, or an aqueous solution or suspension thereof.

In the present invention, the pigment derivative (iii) as explained above is used as one component of a coloring composition, and other components can be those usually used in this art. For example, the condensed azo, triphenodioxadine, dianthraquinonyl, benzimidazolone, anthrapyrimidine, flavanthorone, antanethorone, indanethorone, pyranthorone, violanthorone, isoviolanthorone, quinacridone, quinophtharone, phthalocyanine, diletopyrrolopyrrole, isoindolinone, perynone, perylene, thioindigo pigments and the like exemplified above as constituting a mother skeleton of the pigment derivative (iii) can also be used as a pigment (i) which is a coloring component of the composition. It is preferable that the main pigment of the organic pigment (i) is substantially the same as the mother skeleton constituting the pigment derivative (iii) described above, although a color controlling pigment may also be used together in addition to a main pigment corresponding to the intended color sometimes.

Pigments including a main pigment and a color controlling pigment are used in an amount usually from 5 to 80% by weight, preferably from 20 to 50% by weight based on the total amount of solid components in a coloring composition. In general, the ratio by weight of a main pigment to a color controlling pigment is preferably in the range from 100:0 to 50:50, more preferably in the range from 100:0 to 60:40, in a coloring composition for a color filter. It is preferable to use the pigment derivative (iii) according to the present invention in an amount from 0.5 to 30% by weight, more preferably from 1 to 20% by weight, based on the amount of organic pigment (i) which is a coloring component in the composition.

The binder resin which is another component in the coloring composition of the present invention can be a thermosetting resin, thermoplastic resin, photosensitive resin and the like. Such a binder resin is used in an amount usually from about 5 to 90% by weight, preferably from about 20 to 70% by weight based on the total amount of solid components in the coloring composition.

Examples of the thermosetting or thermoplastic binder resin include a phenol resin, alkyd resin, polyester resin, amino resin, urea resin, melamine resin, guanamine resin, epoxy resin, styrene resin, vinyl resin, vinyl chloride resin, vinyl chloride/vinyl acetate copolymer resin, acryl resin, polyurethane resin, silicone resin, polyamide resin, polyimide resin, rubber-based resin, cyclic rubber, maleic oil-based resin, butyral resin, polybutadiene resin, cellulose resin, chlorinated polyethylene, chlorinated polypropylene and the like.

Examples of the photosensitive resin include resins obtained by introducing a photo-crosslinkable group derived from a compound having a reactive unsaturated bond such as (meth)acrylic compounds, cinnamic acid-based compounds or vinylester-based compounds into a linear polymer having a reactive substituent such as a hydroxyl group, carboxyl group or amino group optionally via an isocyanate group, aldehyde group, epoxy group and the like. Further, compounds obtained by half-esterification with a (meth) acrylic compound having a hydroxyl group such as a hydroxyalkyl (meth)acrylate of a liner polymer containing as a constituent unit an acid anhydride such as a styrene/maleic anhydride copolymer and α-olefin/maleic anhydride copolymer can also be used as the photosensitive resins.

The coloring composition of the present invention can be produced by mixing the above-described organic pigment (i), binder resin (ii) and pigment derivative (iii) with a solvent, dispersing agent and the like, and optionally with a photo-polymerizable monomer, photo-polymerization initiator and the like, followed by dispersing the resulting mixture using a dispersing machine such as a roll mill, ball mill, sand mill or bead mill, and optionally further conducting letdown (dilution). By inclusion of a photo-polymerizable monomer and photo-polymerization initiator, a negative type photo-sensitive coloring composition is obtained in which an exposed part is cured and remains as a filter element after development.

Examples of the solvent used include ethylene glycol monoalkyl ethers, diethylene glycol dialkyl ethers, ethylene glycol alkylethere acetates, propylene glycol alkyl ether acetates, aromatic hydrocarbons, ketones, alcohols, esters, cyclic esters and the like. These solvents can be used alone or in combination of two or more species. The solvent is used in an amount usually from about 0.2 to 50 times, preferably from about 1 to 20 times by weight based on the total amount of solid components in the coloring composition.

As the dispersing agent, known agents can be widely used, and examples thereof include polyester-based polymer dispersing agents, acrylic polymer dispersing agents, polyurethane-based polymer dispersing agents, pigment derivatives, cationic surfactants, anionic surfactants, non-ionic surfactants and the like. These dispersing agent can be used alone or in combination of two or more species. The dispersing agent is used in an amount usually from about 1 to 50 parts by weight, preferably from about 5 to 40 parts by weight based on 100 parts by weight of pigments in the coloring composition.

Examples of the photo-polymerizable monomer include monofunctional monomers such as nonylphenylcarbitol acrylate, 2-hydroxy-3-phenoxypropyl acrylate, 2-ethylhexyl carbitol acrylate, 2-hydroxyethyl acrylate and N-vinylpyrrolidone, bifunctional monomers such as tripropylene glycol diacrylate, triethylene glycol diacrylate, tetraethylene glycol diacrylate, polyethylene glycol diacrylate and bisphenol A diacrylate, trifunctional monomers such as trimethylolpropane triacrylate and pentaerythritol triacrylate, other polyfunctional monomers such as dipentaerythritol penta and hexaacrylate, and the like. These photo-polymerizable monomers can also be used alone or in combination of two or more species. The photo-polymerizable monomer is used in an amount usually from about 5 to 90% by weight, preferably from about 20 to 70% by weight based on the total amount of solid components in the coloring composition.

Examples of the photopolymerization initiator include benzoin, alkylethers of benzoin, acetophenones, thioxanetones, ketals, benzophenones, anthraquinones, xanthones, triazines, hexaarylbisimidazole-based compounds and the like. These photo-polymerization initiator can be used alone or in combination of two or more species. The photo-polymerization initiator is used in an amount usually from about 0.2 to 50% by weight, preferably from about 2 to 20% by weight based on the total amount of a binder resin and a photo-polymeriable monomer.

The coloring composition of the present invention can be used to form a transparent coloring pattern on a substrate such as glass and the like by a known method such as a pigment dispersing method, electrodeposition method, printing method and the like. For example, color elements having the intended color can be obtained by coating a coloring composition prepared as described above onto a substrate, drying the resulting coat, irradiating a ultraviolet ray through a mask to cure the dried coat, then, allowing the cured coat to contact with a dilute aqueous alkali solution or a suitable organic solvent to dissolve uncured parts for development. Using the coloring composition of the present invention, any of color elements of red, green and blue, a color filter usually having them, can be produced. The coloring composition of the present invention may be applied to all of the color elements of red, green and blue, or may also be applied to one or two colors while applying other composition to the remaining color to produce a color filter. The order for producing respective color elements of red, green and blue is not restricted.

EXAMPLE

The following examples further illustrate the present invention in more detail below, but should not be construed to limit the scope thereof. In the examples, parts are by weight.

Synthesis Example 1 (preparation of pigment derivative)

50 parts of C. I. Pigment Red 242 was added to 125 parts of chlorosulfonic acid, and the mixture was stirred for 3 hours at 60° C. Then, the mixture was poured into 1300 parts of ice water. The resulting suspension was filtered then washed with water to obtain 190 parts of a filter cake. This reaction product, filter cake, was added to 660 parts of water to prepare a slurry. The slurry was stirred for 3 hours at 30° C. to hydrolyze a part of a chlorosulfonyl group, then, to this was added 80 parts of N,N-di-n-butyl-1,3-propanediamine. The resulting mixture was further stirred for 3 hours, filtered, washed with water, and dried to obtaine a pigment derivative represented by the following formula. This is named a red 242 derivative.

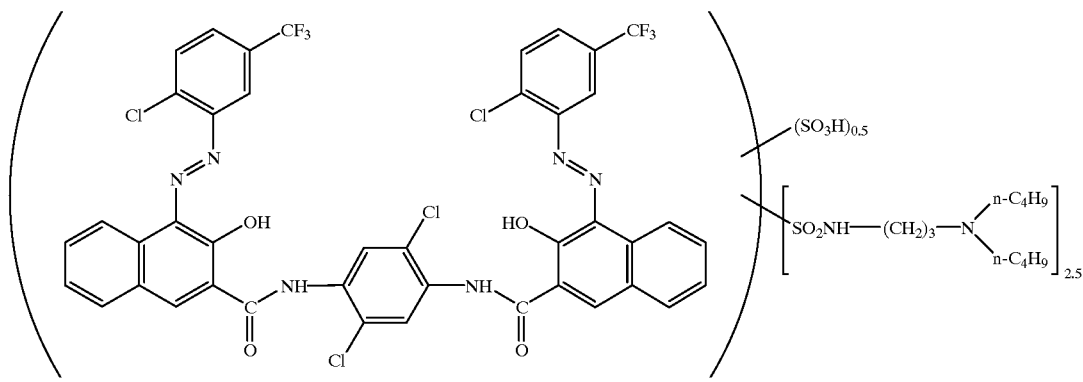

The average number of sulfonate groups and the average number of sulfonamide groups introduced into C. I. Pigment Red 242, which are described in the formula (I) above, were measured by fractional quantitative determination of all amine components by perchloric acid titration in a glacial acetic acid solvent system, fractional quantitative determination of all acid components by sodium hydroxide titration in a piridine/water solvent system, fractional quantitative determination of remaining amine components by an alkali extraction—gas chromatograph method, and fractional quantitative determination of remaining chlorine components by silver nitrate titration in a N,N-dimethylformamide/water solvent system. Synthesis Example 2 (preparation of other pigment derivative)

40 parts of C. I. Pigment Violet 23 which had not been purified after synthesis was added to 320 parts of chlorosulfonic acid. The mixture was stirred for 3 hours at 60° C., then poured into 3000 parts of ice water. The resulting suspension was filtered then washed with water to obtain 220 parts of a filter cake. This reaction product, filter cake was added to 1000 parts of water to prepare a slurry. The slurry was stirred for 3 hours at 30° C. to hydrolyze a part of a chlorosulfonyl group, then, to this was added 25 parts of N,N-di-n-butyl-1,3-propanediamine. The resulting mixture was further stirred for 3 hours, filtered, washed with water, and dried to obtained a pigment derivative represented by the following formula. This is named a Violet 23 derivative.

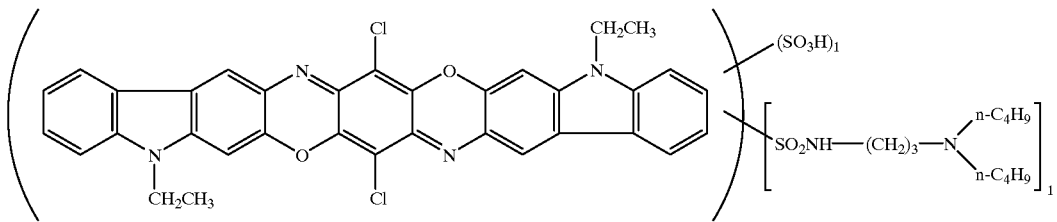

The average number of sulfonate groups and the average number of sulfonamide groups introduced into C. I. Pigment Violet 23 were measured in the same manner as in Synthesis Example 1.

By conducting the same procedure as in Synthesis Example 1 or 2 changing the raw material thereof, there can be obtained compounds in which a sulfonate group and sulfonamide group are bonded to various pigments. For example, C. I. Pigment Red 177 can be chlorosulfonylated and allowed to react with a suitable diamine to obtaine a pigment derivative corresponding to the formula (Id) which is also useful as a component of a color filter.

Examples in which coloring compositions were prepared using the pigment derivatives obtained in Synthesis Examples 1 and 2, and evaluated will be described below. Materials used in the following examples are as described below, and they are sometimes represented by respective marks.

(1) Pigment
C. I. Pigment Red 242: "Sandorin Scarlet 4RF" manufactured by Clariant.
C. I. Pigment Violet 23: "Sumitomo Fast Violet R-XLA" manufactured by Sumitomo Chemical Co., Ltd.
(2) Pigment derivative
Red 242 derivative: compound obtained in Synthesis Example 1, containing C. I. Pigment Red 242 as the mother skeleton Violet 23 derivative: compound obtained in Synthesis Example 2, containing C. I. Pigment Violet 23 as the mother skeleton (3) Binder resin
Binder resin: methacrylic acid/benzyl methacrylate copolymer, acid value: 100 mg-KOH/g, weight-average molecular weight: about 50,000
(4) Solvent
Solvent PGMEA: propylene glycol monomethyl ether acetate
(5) Dispersing agent
Dispersing agent Disperbyk: polymer dispersing agent Disperbyk 161 maufactured by BYK Chemie (concentration is 30% by weight, and in the following examples, amount used is represented in terms of solid components)
(6) Photo-polymerizable monomer; dipentaerythritol hexaacrylate
(7) Photo-polymerization initiator
Initiator MMP: 2-methyl-1-(4-methylthiophenyl)-2-morpholinopropane-1-one
Initiator DETX: 2,4-diethylthioxanetone
(8) Glass bead: manufactured by Toshiba Barotini Corp. ??, φ=1.5 to 1.92 mm Example 1
<Preparation of coloring composition>
The following components were charged into a 140 ml mayonnaise bottle, and treated for 2 hours by a paint conditioner to be dispersed.

| | |
|---|---|
| C. I. Pigment Red 242 | 4.36 parts |
| Red 242 derivative | 0.44 parts |
| Binder resin | 2.33 parts |
| Solvent PGMEA | 16.52 parts |
| Dispersing agent Disperbyk | 1.92 parts |
| Glass bead | 90.00 parts |

Then, the following components were added and the mixture was further subjected to letdown for 10 minutes by a paint conditioner to prepare a coloring composition.

| | |
|---|---|
| Binder resin | 0.89 parts |
| Solvent PGMEA | 63.07 parts |
| Photo-polymerizable monomer | 1.38 parts |
| Initiator MMP | 0.46 parts |
| Initiator DETX | 0.23 parts |

<Production of a color element>
The coloring composition prepared above (containing no glass bead) was coated using a spin coater at 500 to 1,500 rpm onto a glass substrate, then, pre-baked at 100° C. for 3 minutes to dry the coloring coat. Then, this coloring coat was exposed at 200 mJ/$cm^2$ using a high pressure mercury lamp, then, post-baked at 220° C. for 30 minutes to cure the coloring dried coat to obtain a color element for a color filter.

<Evaluation of color property>

Color property (x,y) of the above-described color element was measured by microscope spectrophotometer (OSP-LPS20 manufactured by Olympus Optical Co., Ltd.), and contrast was measured using a luminance meter according to the following method.

Contrast Measuring Method

Backlight: fluorescent lamp FL-W-10N-EDL manufactured by Toshiba Corp.

Polarization plate: NPF-G1220 DU manufactured by Nitto Denko Corp.

Light intercepting machine: luminance meter BM-5A manufactured by Topcon.

A color filter sample is placed between two polarization plates, and the ratio of parallel luminance to crossing luminance given by the polarization plates is recognized as contrast.

Coat propeties and contrast at certain chromaticity [(x, y)=(0.58, 0.36)] measured as described above are shown in Table 1.

Comparative Example 1

The same procedure as in Synthesis Example 1 was conducted except that the red 242 derivative was not used and the amount of C. I. Pigment Red 242 was changed to 4.80 parts. The results are shown in Table 1.

TABLE 1

Result of color property evaluation [(x, y) = (0.58, 0.36)]

| Example No. | Pigment derivative | Coating unevenness | Contrast |
|---|---|---|---|
| Example 1 | Used | None | 400 |
| Comparative example 1 | None | Unevenness in the form of ring | 100 |

Example 2

<Preparation of coloring composition>

The following components were charged into a 140 ml mayonnaise bottle, and treated for 2 hours by a paint conditioner to be dispersed.

| C. I. Pigment Violet 23 | 4.36 parts |
|---|---|
| Violet 23 derivative | 0.44 parts |
| Binder resin | 2.33 parts |
| Solvent PGMEA | 16.52 parts |
| Dispersing agent Disperbyk | 1.92 parts |
| Glass bead | 90.00 parts |

Then, the following components were added and the mixture was further subjected to letdown for 10 minutes by a paint conditioner to prepare a coloring composition.

| Binder resin | 0.89 parts |
|---|---|
| Solvent PGMEA | 33.71 parts |
| Photo-polymerizable monomer | 1.38 parts |
| Initiator MMP | 0.46 parts |
| Initiator DETX | 0.23 parts |

<Production of coloring filter>

The coloring composition prepared above (containing no glass bead) was coated using a spin coater at 1,000 to 1,900 rpm onto a glass substrate, then, pre-baked at 100° C. for 3 minutes to dry the coloring coat. Then, this coloring coat was exposed at 200 mJ/cm$^2$ using a high pressure mercury lamp, then, post-baked at 220° C. for 30 minutes to cure the coloring dried coat to obtain a coloring filter.

<Evaluation of color property>

Color property (x,y) and contrast of the color element prepared above were measured in the same manners as in Example 1. Coat properties and contrast at certain chromaticity [(x,y)=(0.24, 0.13)] are shown in Table 2.

Comparative Example 2

The same procedure as in Synthesis Example 2 was conducted except that the violet 23 derivative was not used and the amount of C. I. Pigment Violet 23 was changed to 4.80 parts. The results are shown in Table 2.

TABLE 2

Result of color property evaluation [(x, y) = (0.24, 0.13)]

| Example No. | Pigment derivative | Coating unevenness | Contrast |
|---|---|---|---|
| Example 2 | Used | None | 400 |
| Comparative example 2 | None | Unevenness in the form of ring | 100 |

As shown in Tables 1 and 2, by using a pigment derivative of the present invention, dispersibility of a coloring composition is improved, unevenness does not occur in a coat, and contrast is improved.

When the coloring composition of the present invention is used, a color filter can be produced which manifests excellent coat property, has not special color unevenness and has excellent contrast since the composition is excellent in dispersibility.

What is claimed is:

1. A coloring composition for a color filter, which comprises (i) an organic pigment, (ii) a binder, (iii) a pigment derivative which is an organic pigment to which a sulfonate group and a sulfonamide group are bonded or a salt thereof, and (iv) a photo-polymerizable monomer.

2. A coloring composition according to claim 1 wherein the organic pigment to which a sulfonate group and a sulfonamide group are bonded is a compound represented by the following formula (I):

wherein D represents an organic pigment residue;

R$^1$ represents a hydrogen atom or a hydrocarbon residue which may be substituted;

X represents a group —C$_k$H$_{2k}$NR$^2$R$^3$, wherein k represents a number from 1 to 10, and R$^2$ and R$^3$ each independently represents a hydrocarbon residue which may be substituted, or R$^2$, R$^3$ and the nitrogen atom to which R$^2$ and R$^3$ are bonded together form a hetero ring which may optionally contain another hetero atom selected from nitrogen, oxygen and sulfur as a ring atom, or X represents an alkyl group which is substituted with a hetero ring containing at least one hetero atom selected from nitrogen, oxygen and sulfur as a ring atom, the alkyl group bonding to a carbon atom in the hetero ring; or $R^1$, X and the nitrogen atom to which $R^1$ and X are bonded together form a hetero ring containing at least one other nitrogen atom as a ring atom;

m represents a number from 0.5 to 3; and n represents a number from 0.5 to 3.5.

3. A coloring composition according to claim 2 wherein $R^1$ is a hydrogen atom or an alkyl group having 1 to 6 carbon atoms which may be optionally substituted; and X is a group of formula —$C_kH_{2k}NR^2R^3$, wherein k represents a number from 1 to 10, and $R^2$ and $R^3$ each independently represents an alkyl group having 1 to 6 carbon atoms which may be optionally substituted or $R^2$, $R^3$ and the nitrogen atom to which $R^2$ and $R^3$ are bonded together form a hetero ring which may optionally contain another hetero atom selected from nitrogen, oxygen and sulfur as a ring atom; or $R^1$, X and the nitrogen atom to which $R^1$ and X are bonded form a hetero ring represented by the following formula (V):

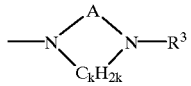

(V)

wherein A represents a direct bond, methylene chain or ethylene chain, and k and $R^3$ are as defined above.

4. A coloring composition according to claim 2, wherein the compound of formula (I) is represented by the following formula (Ia):

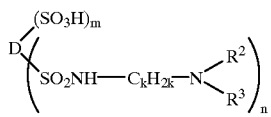

(Ia)

wherein D represents an organic pigment residue;

k represents a number from 1 to 10;

$R^2$ and $R^3$ each independently represents a hydrocarbon residue which may be optionally substituted, or $R^2$, $R^3$ and the nitrogen atom to which $R^2$ and $R^3$ are bonded together form a hetero ring which may optionally contain another hetero atom selected from nitrogen, oxygen and sulfur as a ring atom;

m represents a number from 0.5 to 3; and n represents a number from 0.5 to 3.5.

5. A coloring composition according to claim 2, wherein the total of m and n is in the range from 1 to 5.

6. A coloring composition according to claim 1, wherein the organic pigment which residue is to be bonded to a sulfonate group and a sulfonamide group to form the pigment derivative, (iii) is the same to a component of an organic pigment (i).

7. A coloring composition according to claim 1, wherein amount of the pigment derivative (iii) is from 0.5 to 30% by weight, based on the amount of organic pigment (i).

8. A coloring composition for a color filter, which comprises (i) an organic pigment, (ii) a binder which is a photosensitive resin, and (iii) a pigment derivative which is an organic pigment to which a sulfonate group and a sulfonamide group are bonded or a salt thereof.

* * * * *